(12) United States Patent
Langhammer et al.

(10) Patent No.: US 10,790,829 B2
(45) Date of Patent: Sep. 29, 2020

(54) LOGIC CIRCUITS WITH SIMULTANEOUS DUAL FUNCTION CAPABILITY

(71) Applicant: Intel Corporation, Santa Clara, CA (US)

(72) Inventors: Martin Langhammer, Alderbury (GB); Sergey Gribok, Santa Clara, CA (US); Gregg William Baeckler, San Jose, CA (US)

(73) Assignee: Intel Corporation, Santa Clara ( * ) Notice: Subject to any disclaimer, the term of this patent is extended or adjusted under 35 U.S.C. 154(b) by 0 days.

(21) Appl. No.: 16/144,558

(22) Filed: Sep. 27, 2018

(65) Prior Publication Data
US 2020/0106442 A1 Apr. 2, 2020

(51) Int. Cl.
*H03K 19/17736* (2020.01)
*H03K 19/173* (2006.01)
*G06F 7/523* (2006.01)
*G06F 7/501* (2006.01)
*H03K 19/17728* (2020.01)

(52) U.S. Cl.
CPC ....... *H03K 19/17744* (2013.01); *G06F 7/501* (2013.01); *G06F 7/523* (2013.01); *H03K 19/1737* (2013.01); *H03K 19/17728* (2013.01)

(58) Field of Classification Search
None
See application file for complete search history.

(56) References Cited

U.S. PATENT DOCUMENTS

| | | | |
|---|---|---|---|
| 4,864,524 A * | 9/1989 | Guilfoyle | G02F 3/00 708/191 |
| 5,164,913 A * | 11/1992 | Guilfoyle | G02F 3/00 708/191 |
| 5,561,619 A | 10/1996 | Wantanabe et al. | |
| 5,848,285 A | 12/1998 | Kapusta et al. | |
| 6,157,209 A * | 12/2000 | McGettigan | G06F 7/5055 326/38 |
| 6,288,570 B1 * | 9/2001 | New | G06F 7/503 326/40 |
| 6,516,331 B2 | 2/2003 | Beiu | |
| 7,185,035 B1 * | 2/2007 | Lewis | G06F 7/501 708/235 |

(Continued)

OTHER PUBLICATIONS

Langhammer et al., "High Density and Performance Multiplication for FPGA", 25th IEEE Symbosium on Computer Arithmetic (ARITH 2018) <http://www.ecs.umass.edu/arith-2018/program.html#content>.

*Primary Examiner* — Crystal L Hammond
(74) *Attorney, Agent, or Firm* — Treyz Law Group, PC.; Jason Tsai

(57) ABSTRACT

Integrated circuits with programmable logic regions are provided. The programmable logic regions may be organized into smaller logic units sometimes referred to as a logic element. A logic element may include four lookup tables coupled to an adder carry chain. At least some of the lookup tables are configured to output combinatorial outputs, whereas the adder carry chain are used to output sum outputs. Both the combinatorial outputs and the sum outputs may be used simultaneously to support a multiplication operation, three or more logic operations, or arithmetic and combinatorial operations in parallel.

19 Claims, 15 Drawing Sheets

(56) References Cited

U.S. PATENT DOCUMENTS

| | | | |
|---|---|---|---|
| 7,193,436 B2 * | 3/2007 | Wang | H03K 19/17728 326/38 |
| 7,218,139 B1 * | 5/2007 | Young | H03K 19/1736 326/38 |
| 7,233,168 B1 * | 6/2007 | Simkins | G06F 5/01 326/38 |
| 7,236,008 B1 * | 6/2007 | Cliff | H03K 19/17728 326/39 |
| 7,260,595 B2 * | 8/2007 | Talwar | G06F 7/508 708/712 |
| 7,336,099 B1 * | 2/2008 | Nancekievill | G06F 7/501 326/38 |
| 7,565,388 B1 * | 7/2009 | Baeckler | G06F 7/509 708/235 |
| 7,663,400 B1 * | 2/2010 | Plants | G06F 7/506 326/38 |
| 7,701,260 B1 * | 4/2010 | Old | G06F 1/0353 327/106 |
| 7,902,864 B1 * | 3/2011 | Hutton | H03K 19/17736 326/38 |
| 9,362,913 B1 * | 6/2016 | Schmit | H03K 19/00392 |
| 2002/0116426 A1 * | 8/2002 | Swami | G06F 1/0356 708/235 |
| 2004/0145942 A1 * | 7/2004 | Leijten-Nowak | H03K 19/17728 365/154 |
| 2006/0059000 A1 * | 3/2006 | Gigi | G10L 13/07 704/258 |
| 2009/0167351 A1 * | 7/2009 | Agarwal | H03K 19/177 326/41 |
| 2013/0257476 A1 * | 10/2013 | Cashman | H03K 19/17728 326/38 |
| 2015/0121035 A1 * | 4/2015 | Steele, Jr. | G06F 12/1018 711/216 |
| 2019/0042197 A1 * | 2/2019 | Langhammer | G06F 17/505 |

* cited by examiner $C = \{A1, A0\} * \{B1, B0\}$

⇓

|   |   | 0 | 0 | $A1 * B0$ | $A0 * B0$ |
|---|---|---|---|-----------|-----------|
| + |   | 0 | $A1 * B1$ | $A0 * B1$ | 0 |
|   |   | C[3] | C[2] | C[1] | C[0] |

FIG. 7A

| (A1) 1st Input to LUT1 | (A0) 2nd Input to LUT1 | (B1) 3rd Input to LUT1 | (B0) 4th Input to LUT1 | LUT1 Output | Desired C[3] | Known A0*B0 | Carry Output |
|---|---|---|---|---|---|---|---|
| 0 | 0 | 0 | 0 | 0 | 0 | 0 | 0 |
| 0 | 0 | 0 | 1 | 0 | 0 | 0 | 0 |
| 0 | 0 | 1 | 0 | 0 | 0 | 0 | 0 |
| 0 | 0 | 1 | 1 | 0 | 0 | 0 | 0 |
| 0 | 1 | 0 | 0 | 0 | 0 | 0 | 0 |
| 0 | 1 | 0 | 1 | 1 | 0 | 1 | 1 |
| 0 | 1 | 1 | 0 | 0 | 0 | 0 | 0 |
| 0 | 1 | 1 | 1 | 1 | 0 | 1 | 1 |
| 1 | 0 | 0 | 0 | 0 | 0 | 0 | 0 |
| 1 | 0 | 0 | 1 | 0 | 0 | 0 | 0 |
| 1 | 0 | 1 | 0 | 0 | 0 | 0 | 0 |
| 1 | 0 | 1 | 1 | 0 | 0 | 0 | 0 |
| 1 | 1 | 0 | 0 | 0 | 0 | 0 | 0 |
| 1 | 1 | 0 | 1 | 1 | 0 | 1 | 1 |
| 1 | 1 | 1 | 0 | 0 | 0 | 0 | 0 |
| 1 | 1 | 1 | 1 | 0 | 1 | 1 | 0 |

FIG. 7C

| (A1) 1st Input to LUT3 | (B0) 2nd Input to LUT3 | (B1) 3rd Input to LUT3 | (A0) 4th Input to LUT3 | Known LUT3 Output | Carry Input | Desired C[2] | LUT2 Output |
|---|---|---|---|---|---|---|---|
| 0 | 0 | 0 | 0 | 0 | 0 | 0 | 0 |
| 0 | 0 | 0 | 1 | 0 | 0 | 0 | 0 |
| 0 | 0 | 1 | 0 | 0 | 0 | 0 | 0 |
| 0 | 0 | 1 | 1 | 1 | 0 | 0 | 1 |
| 0 | 1 | 0 | 0 | 0 | 0 | 0 | 0 |
| 0 | 1 | 0 | 1 | 0 | 1 | 0 | 1 |
| 0 | 1 | 1 | 0 | 0 | 0 | 0 | 0 |
| 0 | 1 | 1 | 1 | 1 | 1 | 0 | 0 |
| 1 | 0 | 0 | 0 | 0 | 0 | 0 | 0 |
| 1 | 0 | 0 | 1 | 0 | 0 | 0 | 0 |
| 1 | 0 | 1 | 0 | 0 | 0 | 1 | 1 |
| 1 | 0 | 1 | 1 | 1 | 0 | 1 | 0 |
| 1 | 1 | 0 | 0 | 1 | 0 | 0 | 1 |
| 1 | 1 | 0 | 1 | 1 | 1 | 0 | 0 |
| 1 | 1 | 1 | 0 | 1 | 0 | 1 | 0 |
| 1 | 1 | 1 | 1 | 0 | 0 | 0 | 0 |

|   |   |   |   |   |   |   |
|---|---|---|---|---|---|---|
|   | 0 | 0 | 0 | A2 * B0 | A1 * B0 | A0 * B0 |
|   | 0 | 0 | A2 * B1 | A1 * B1 | A0 * B1 | 0 |
| + | 0 | A2 * B2 | A1 * B2 | A0 * B2 | 0 | 0 |
|   | C[5] | C[4] | C[3] | C[2] | C[1] | C[0] |

| 1st Input of LUTx | 2nd Input of LUTx | 3rd Input of LUTx | 4th Input of LUTx | XOR Output |
|---|---|---|---|---|
| 0 | 0 | 0 | 0 | 0 |
| 0 | 0 | 0 | 1 | 1 |
| 0 | 0 | 1 | 0 | 1 |
| 0 | 0 | 1 | 1 | 0 |
| 0 | 1 | 0 | 0 | 1 |
| 0 | 1 | 0 | 1 | 0 |
| 0 | 1 | 1 | 0 | 0 |
| 0 | 1 | 1 | 1 | 1 |
| 1 | 0 | 0 | 0 | 1 |
| 1 | 0 | 0 | 1 | 0 |
| 1 | 0 | 1 | 0 | 0 |
| 1 | 0 | 1 | 1 | 1 |
| 1 | 1 | 0 | 0 | 0 |
| 1 | 1 | 0 | 1 | 1 |
| 1 | 1 | 1 | 0 | 1 |
| 1 | 1 | 1 | 1 | 0 |

FIG. 9B

LOGIC CIRCUITS WITH SIMULTANEOUS DUAL FUNCTION CAPABILITY

BACKGROUND

This relates to integrated circuits such as programmable integrated circuits.

Programmable integrated circuits such as programmable logic devices (PLDs) can be programmed by a user to implement a desired custom logic function. In a typical scenario, a logic designer uses computer-aided design (CAD) tools to design a custom logic circuit. When the design process is complete, the tools generate configuration data. The configuration data is loaded into programmable integrated circuit memory elements to configure the device to perform the functions of the custom logic circuit. In particular, the configuration data configures programmable interconnects, programmable routing circuits, and programmable logic circuits in the programmable integrated circuits.

Conventional programmable integrated circuits include lookup tables (LUTs) configured to perform desired functions of a custom logic circuit. In particular, the lookup tables can be configured in a first mode (i.e., an arithmetic mode that uses the lookup tables in conjunction with a dedicated ripple carry adder chain to perform addition). Alternatively, the lookup tables can instead be configured in a second mode (i.e., a combinatorial logic mode in which the lookup tables are optimized for combinatorial functions which do not use the ripple carry adder chain). In other words, only one of the two modes can be activated at any given point in time.

An artifact of supporting two modes is that the output of the lookup tables are connected to some or all of their possible destinations with dedicated wires, even if those connections are not used for one of the two modes. In other words, some of the output connections would be idle or wasted during either the first or second mode. It is within this context that the embodiments described herein arise.

BRIEF DESCRIPTION OF THE DRAWINGS

FIG. 7A is a diagram illustrating a two-by-two multiplication operation in accordance with an embodiment.

FIG. 7C is an illustrative truth table for the lookup table LUT1 shown in FIG. 7B in accordance with an embodiment.

FIG. 7D is an illustrative truth table for the lookup table LUT3 shown in FIG. FIG. 7B in accordance with an embodiment.

FIG. 8A is a diagram illustrating a three-by-three multiplication operation in accordance with an embodiment.

FIG. 9B is an illustrative truth table for at least some of the lookup tables shown in FIG. 9A in accordance with an embodiment.

DETAILED DESCRIPTION

The present embodiments relate to programmable integrated circuits and more particularly, to programmable integrated circuits that include logic elements that can be configured to support at least first and second modes simultaneously. In the first mode, the logic elements may support one or more combinatorial functions. In the second mode, the logic elements may support one or more arithmetic functions. When the two modes are being simultaneously supported, the combinatorial and the arithmetic functions may clash and interfere with one another.

To logically separate the combinatorial and the arithmetic functions, intermediary functions and their complementary "anti-functions" may be synthesized, and their interactions with one another will generate the desired function outputs for the first and second modes in parallel. Logic elements operated in this way may be configured to support at least 2-by-2 multiplication operations, 3-by-3 multiplication operations, three simultaneous combinatorial functions, and simultaneously arithmetic and combinatorial functions. Using logic elements to support multiple modes simultaneously can help double the density of each logic element, reduce data path size by 20% or more, and reduce the overall system area by 10% or more.

It will be recognized by one skilled in the art, that the present exemplary embodiments may be practiced without some or all of these specific details. In other instances, well-known operations have not been described in detail in order not to unnecessarily obscure the present embodiments.

Figure 1:
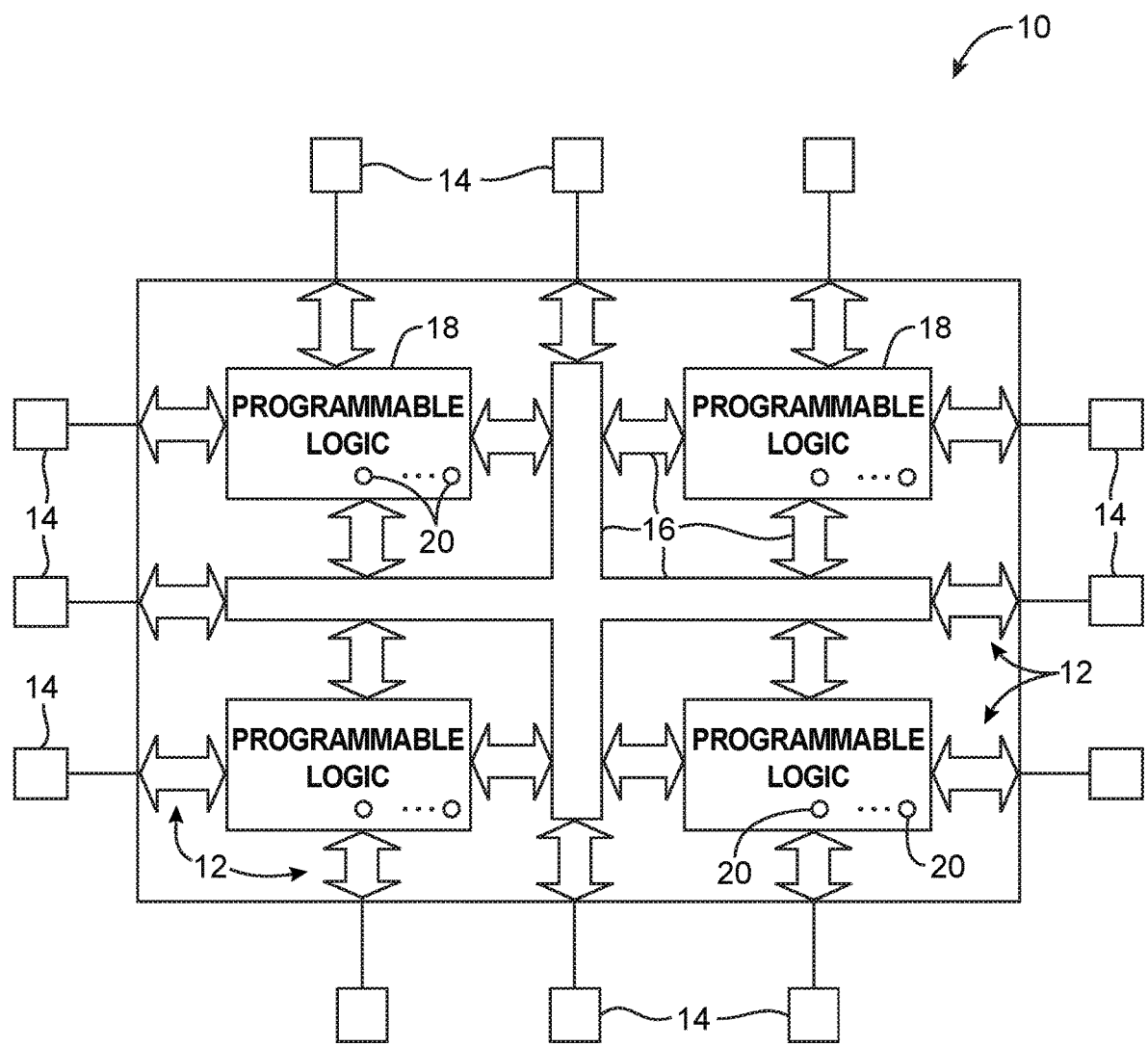
FIG. 1 is a diagram of an illustrative programmable integrated circuit in accordance with an embodiment.

FIG. 1 shows a diagram of an illustrative programmable integrated circuit device. As shown in FIG. 1, device 10 may have input-output (I/O) circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Interconnection resources 16 may sometimes be referred to herein as interconnects (e.g., interconnects formed from combinations of fixed interconnects and programmable interconnects).

Interconnects 16 may be used to interconnect regions of programmable logic such as programmable logic regions 18. Programmable logic regions 18 may sometimes be referred to as logic array blocks or programmable circuit regions. Programmable logic regions 18 may include combinational and sequential logic circuitry. For example, programmable logic regions 18 may include look-up tables, registers, and multiplexers. Programmable logic regions 18 may be configured to perform one or more custom logic functions.

Programmable logic regions 18 contain programmable elements 20. Programmable elements 20 may be based on any suitable programmable technology, such as fuses, antifuses, electrically-programmable read-only-memory technology, random-access memory cells, mask-programmed elements, etc. As an example, programmable elements 20 may be formed from memory cells. During programming, configuration data is loaded into the memory cells using pins 14 and input-output circuitry 12. The memory cells are typically random-access-memory (RAM) cells. Because the RAM cells are loaded with configuration data, they are sometimes referred to as configuration RAM cells (CRAM).

Programmable elements 20 may be used to provide static control output signals for controlling the state of logic components in programmable logic 18. The output signals generated by elements 20 are typically applied to gates of metal-oxide-semiconductor (MOS) transistors (sometimes referred to as pass gate transistors).

The circuitry of device 10 may be organized using any suitable architecture. As an example, logic 18 of programmable device 10 may be organized in a series of rows and columns of larger programmable logic regions, each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Other device arrangements may use logic that is not arranged in rows and columns.

Figure 2:
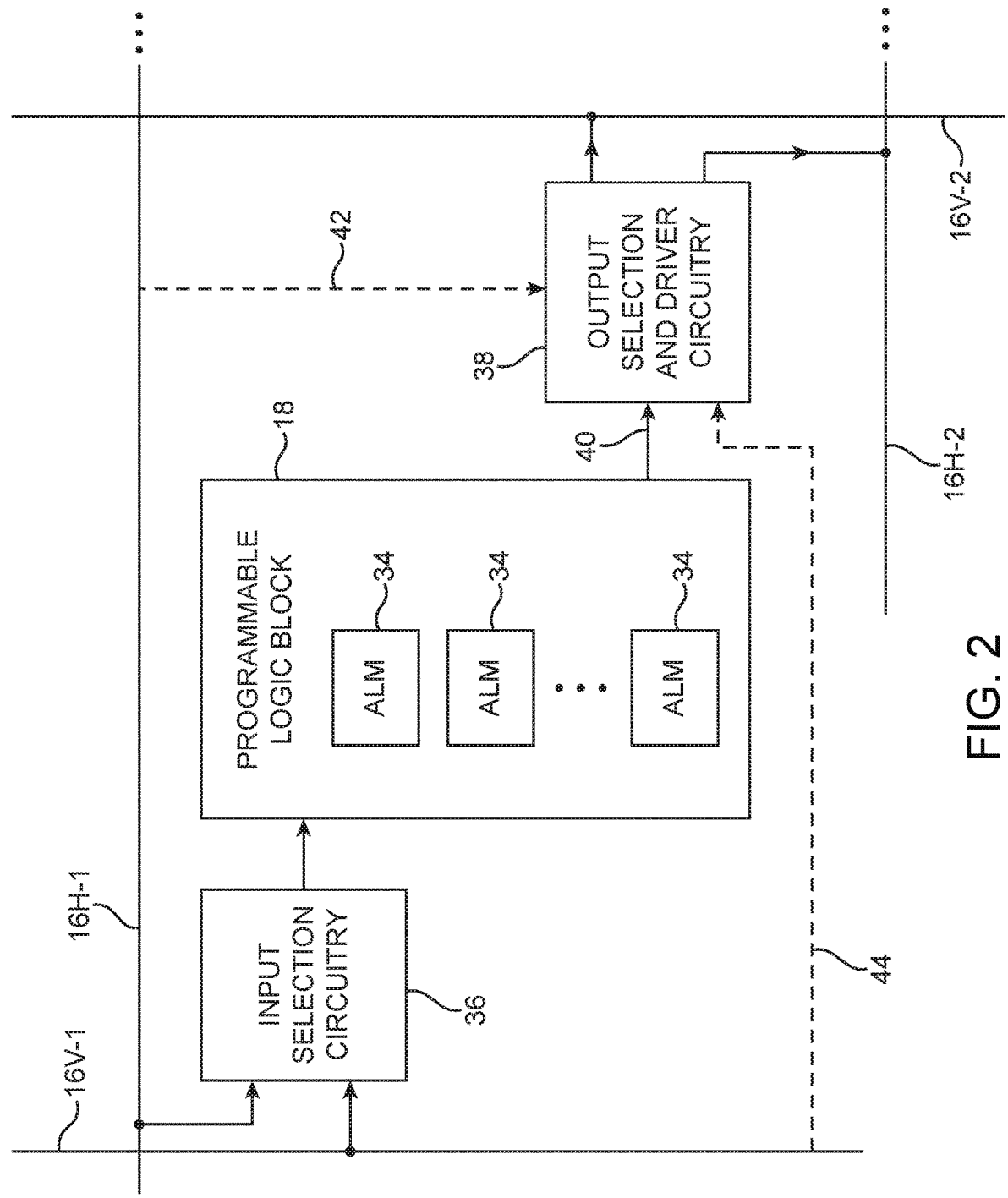
FIG. 2 is a diagram of an illustrative programmable logic block in accordance with an embodiment.

An illustrative programmable logic region 18 including a group of multiple smaller logic regions 34 is shown in FIG. 2. Programmable logic region 18, sometimes referred to as a logic array block (LAB), may have associated input selection circuitry 36 and output selection and driver circuitry 38. Input selection circuitry 36 and output selection and driver circuitry 38 may be formed as part of input-output circuits such as input-output circuits 12 of FIG. 1.

Input selection circuitry 36 may receive input signals via a first set of horizontal interconnects 16H-1 and a first set of vertical interconnects 16V-1. For example, interconnects 16H-1 may provide input signals to programmable logic block 18 from other programmable logic blocks 18 in the same row or from input/output pins 14, whereas interconnects 16V-1 may provide input signals to programmable logic block 18 from other logic blocks 18 in the same column or from pins 14. Input selection circuitry 36 may be configured (e.g., by programming CRAM bits that are associated with input selection circuitry 36) to select one or more of the input signals to provide to programmable logic block 18.

As shown in FIG. 2, programmable logic block 18 may include smaller regions of programmable logic 34. The smaller programmable logic regions 34 within each programmable logic region 18 are sometimes referred to as adaptive logic modules (ALMs) or logic elements (LEs). Logic elements 34 may receive the input signals that are selected by input selection circuitry 36 and may perform custom functions on the input signals to produce output signals. The input signals received by each logic element 34 may overlap with input signal portions received by other logic elements 34 (e.g., some of the input signals received by a first logic region 34 may also be received by a second logic region 34). There may be any suitable number of logic elements 34 within logic block 18.

The output signals may be provided to output selection and driver circuitry 38 via output paths 40. Output selection and driver circuitry 38 may receive output signals via paths 40 and may be configured to provide the output signals to a second set of horizontal interconnects 16H-2 and a second set of vertical interconnects 16V-2.

If desired, output selection circuitry 38 may be configured to disconnect one or more of interconnects 16H-2 or 16V-2 (e.g., by providing no output signal or by providing a high impedance output). If desired, output selection circuitry 38 may be configured to provide a given output signal to multiple interconnects. For example, it may be desirable to route an output signal from a given logic element 34 to two different regions of integrated circuit 10. In this scenario, output selection and driver circuitry 38 may provide that output signal to two different interconnects of different lengths.

In some arrangements, input selection circuitry 36 may include LAB input multiplexers (LIMs) that can be used to select signals from a horizontal channel, a vertical channel, and local outputs from one or more logic elements 34 and to drive a set of LAB lines. The input selection circuitry 36 may also include logic element input multiplexers (LEIMs) that can be used to select signals from some set of LAB lines and to drive the selected signals to logic elements 34. Output selection circuitry 38 may include driver input multiplexers (DIMs) that can be used to select signals from a horizontal channel, a vertical channel, and local outputs from one or more logic elements and to drive wires, which originate in that logic block 18 and route to other logic blocks 18.

Figure 3:
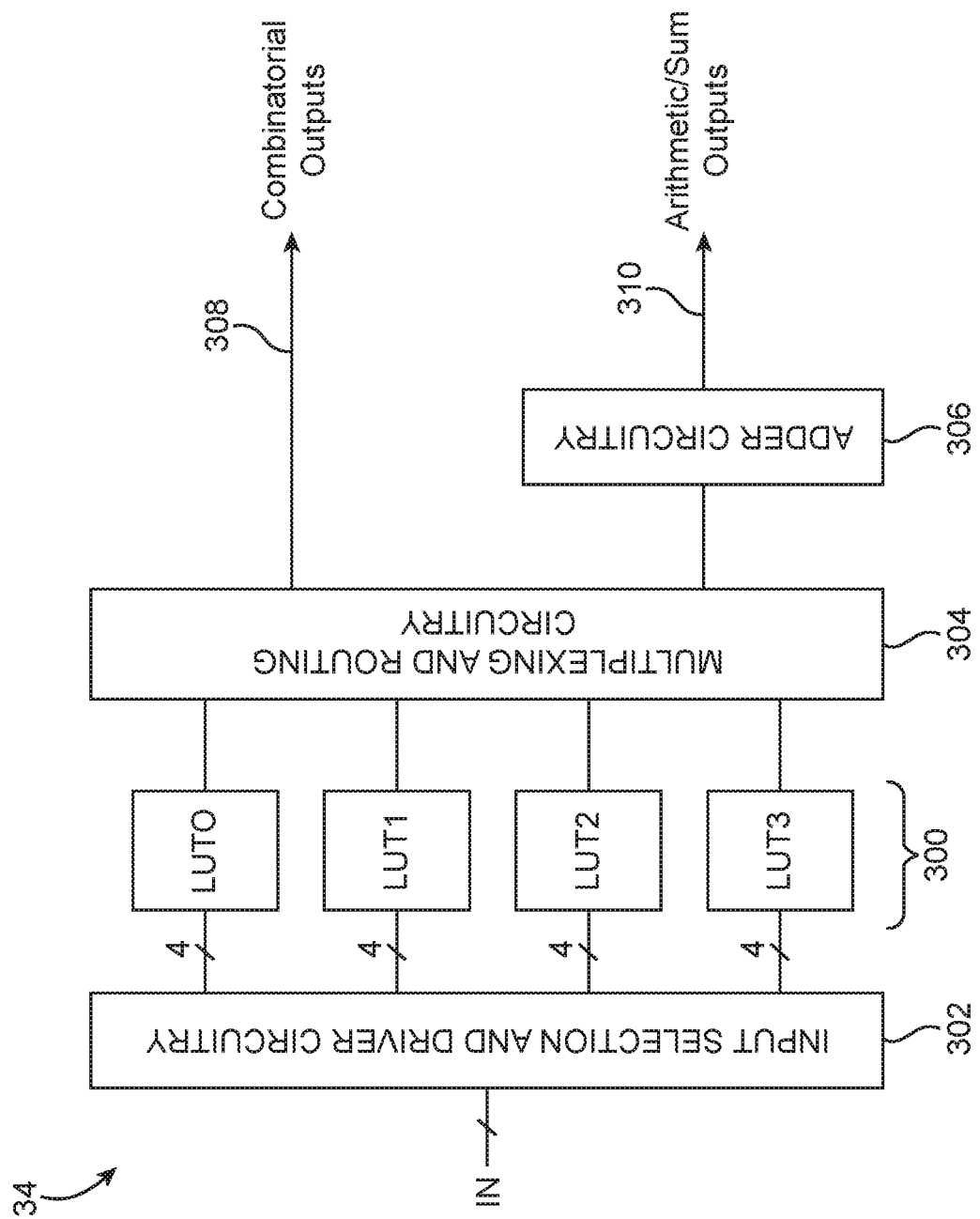
FIG. 3 is a diagram of an illustrative adaptive logic module in accordance with an embodiment.

FIG. 3 is an illustrative example of a logic element 34. As shown in FIG. 3, logic element 34 may include input selection and driver circuitry 302, multiple lookup tables 300, multiplexing and routing circuitry 304, and adder circuitry 306. Input selection and driver circuitry 302 may receive a number of input signals at input port IN and may include drivers for selectively feeding any subset of the received inputs to each of the corresponding lookup tables 300. As examples, logic element 34 may receive at least six input signals, at least seven input signals, eight or more input signals, or any suitable number of input signals at input port IN.

In the example of FIG. 3, logic element 34 includes four separate lookup tables 300 such as lookup tables LUT0, LUT1, LUT2, and LUT3. Each of these lookup tables may be four-input lookup tables, as indicated by the 4-bit input provided from circuitry 302. This is merely illustrative. In general, logic element 34 may include more than four lookup tables or less than four lookup tables, and each lookup table may receive more than four bits or fewer than four bits. Each of these lookup tables may be loaded with a given truth table to implement a desired function.

Circuitry 304 may include multiplexing circuits for selecting from among the signals output from lookup tables 300 and for routing the selected signals to corresponding output ports of logic element 34. A first portion of signals output from circuitry 304 is routed onto output path 308. These signals bypass adder circuitry 306 and therefore represent combinatorial function outputs generated directly by some of the lookup tables. Combinatorial outputs are also sometimes referred to as "combinational" outputs, and these terms may be used interchangeably. A second portion of signals output from circuitry 304 is first processed by adder circuitry 306 (e.g., a dedicated adder chain such as a ripple carry chain). These signals are propagated at least partially along the carry chain within circuitry 306 to generate corresponding signals on output paths 310 and therefore represent arithmetic function or sum outputs.

Arranged in this way, logic element 34 may be operable in a first mode that supports combinatorial functions. In the first mode, combinatorial outputs are generated on output path 308 without using of carry chain 306. The lookup tables 300 may be configured as a single large LUT or may be decomposed into multiple smaller LUTs each having their own output. Logic element 34 may also be operable in a second mode that supports arithmetic functions. In the second mode, arithmetic or sum outputs are generated using carry chain 306 on output path 310. The lookup tables 300 may be decomposed into smaller LUTs, which can individually feed the adder chain bit positions.

In accordance with an embodiment, signals provided on both output paths 308 and 310 are simultaneously used to help double the density of logic element 34 (e.g., the combinatorial outputs and the arithmetic outputs are both in use at a given point in time). Operating logic element 34 to support two different modes at the same time will cause a collision of functions (i.e., one mode will affect the other). To logically separate the combinatorial function from the arithmetic function, which are physically combined but neither or which are implemented directly, intermediary functions and their complementary anti-functions are synthesized such that the interaction between the complementary functions creates the desired outputs on both paths 308 and 310. Operating logic element 34 in the two modes simultaneously will effectively double the size of programmable logic, which can help reduce the area of large arithmetic systems by 10% or more, by 20% or more, by 30% or more, etc.

Figure 4:
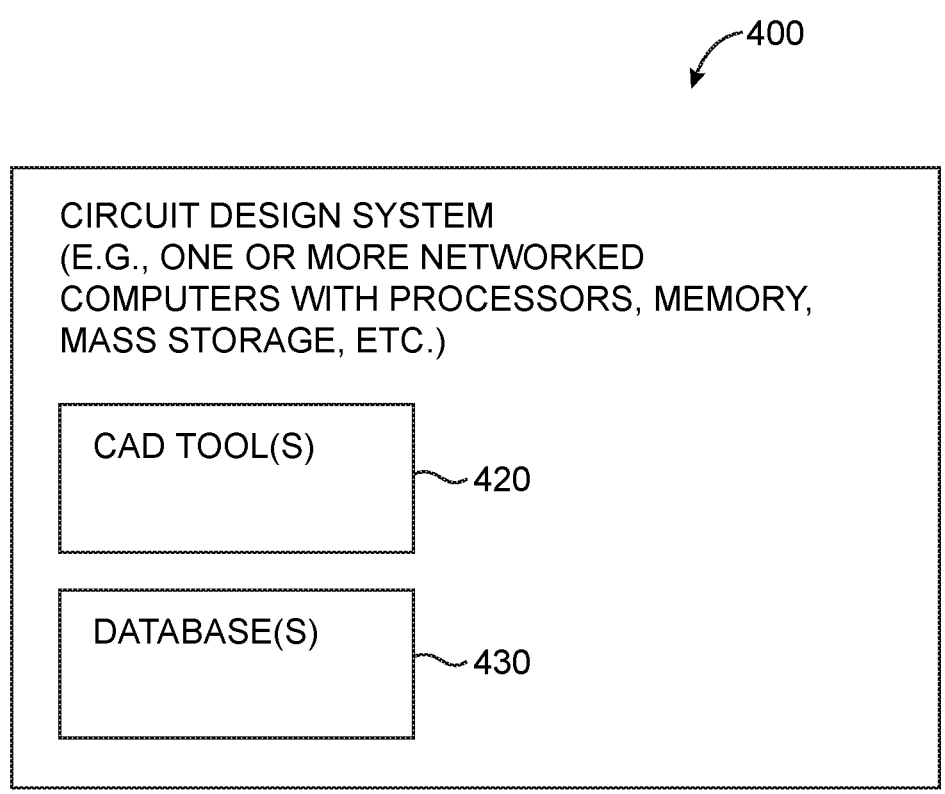
FIG. 4 is a diagram of an illustrative circuit design system that can be used to design integrated circuits in accordance with an embodiment.

An illustrative circuit design system 400 that can be used to design programmable device 10 is shown in FIG. 4. Circuit design system 400 may be implemented on integrated circuit design computing equipment. For example, system 400 may be based on one or more processors such as personal computers, workstations, etc. The processor(s) may be linked using a network (e.g., a local or wide area network). Memory in these computers or external memory and storage devices such as internal and/or external hard disks or non-transitory computer-read storage media may be used to store instructions and data.

Software-based components such as computer-aided design tools 420 and databases 430 reside on system 400. During operation, executable software such as the software of computer aided design tools 420 runs on the processor(s) of system 400. Databases 430 are used to store data for the operation of system 400. The software may sometimes be referred to as software code, data, program instructions, instructions, script, or code. The non-transitory computer readable storage media may include computer memory chips, non-volatile memory such as non-volatile random-access memory (NVRAM), one or more hard drives (e.g., magnetic drives or solid state drives), one or more removable flash drives or other removable media, compact discs (CDs), digital versatile discs (DVDs), Blu-ray discs (BDs), other optical media, and floppy diskettes, tapes, or any other suitable memory or storage device(s).

Software stored on the non-transitory computer readable storage media may be executed on system 400. When the software of system 400 is installed, the storage of system 400 has instructions and data that cause the computing equipment in system 400 to execute various methods (processes). When performing these processes, the computing equipment is configured to implement the functions of circuit design system 400.

The computer aided design (CAD) tools 420, some or all of which are sometimes referred to collectively as a CAD tool, a circuit design tool, or an electronic design automation (EDA) tool, may be provided by a single vendor or by multiple vendors. Tools 420 may be provided as one or more suites of tools (e.g., a compiler suite for performing tasks associated with implementing a circuit design in a programmable logic device) and/or as one or more separate software components (tools). Database(s) 430 may include one or more databases that are accessed only by a particular tool or tools and may include one or more shared databases. Shared databases may be accessed by multiple tools. For example, a first tool may store data for a second tool in a shared database. The second tool may access the shared database to retrieve the data stored by the first tool. This allows one tool to pass information to another tool. Tools may also pass information between each other without storing information in a shared database if desired.

Figure 5:
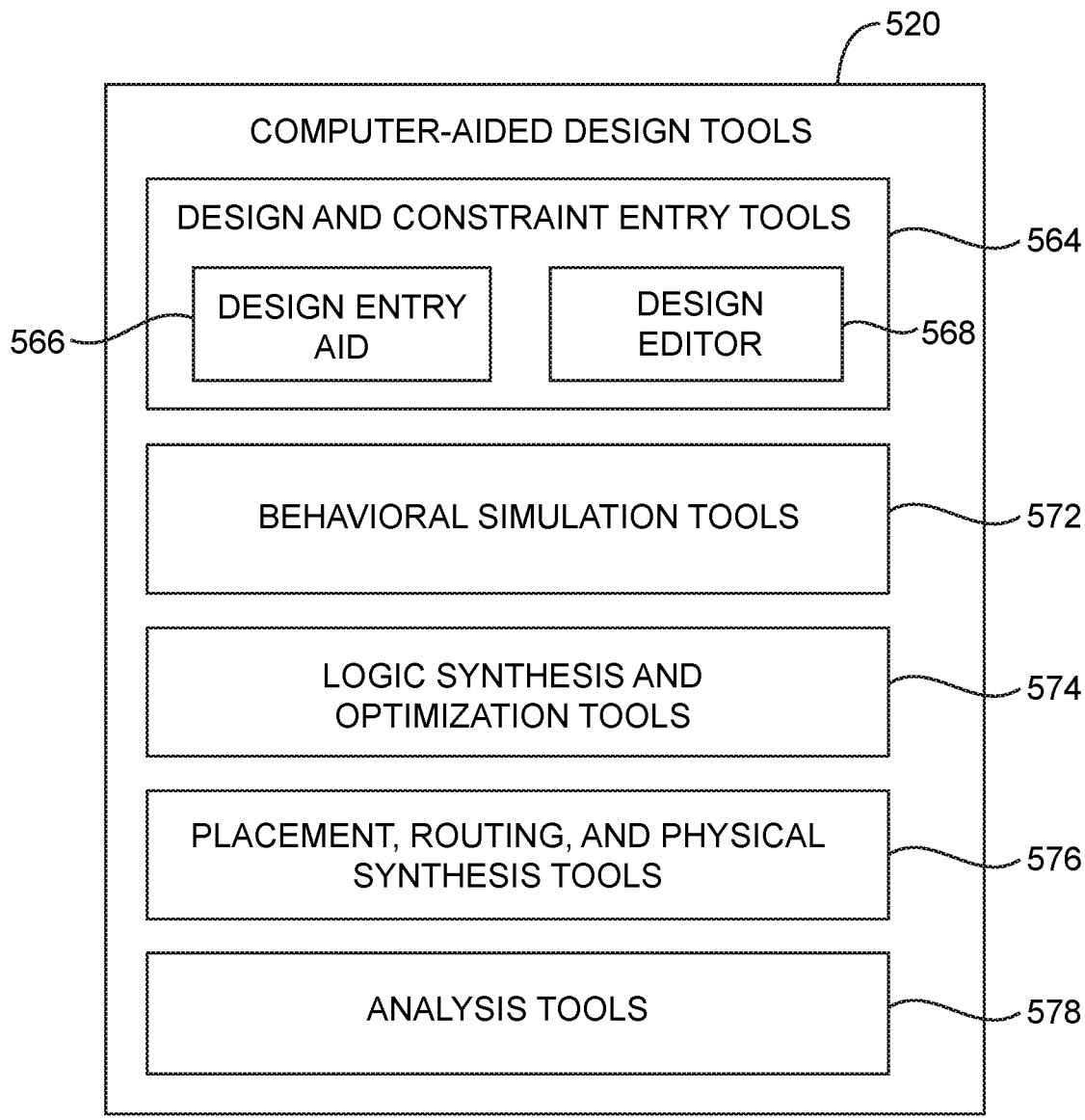
FIG. 5 is a diagram of illustrative computer-aided design (CAD) tools that may be used in a circuit design system in accordance with an embodiment.

Illustrative computer aided design tools 520 that may be used in a circuit design system such as circuit design system 400 of FIG. 4 are shown in FIG. 5.

The design process may start with the formulation of functional specifications of the integrated circuit design (e.g., a functional or behavioral description of the integrated circuit design). A circuit designer may specify the functional operation of a desired circuit design using design and constraint entry tools 564. Design and constraint entry tools 564 may include tools such as design and constraint entry aid 566 and design editor 568. Design and constraint entry aids such as aid 566 may be used to help a circuit designer locate a desired design from a library of existing circuit designs and may provide computer-aided assistance to the circuit designer for entering (specifying) the desired circuit design.

As an example, design and constraint entry aid 566 may be used to present screens of options for a user. The user may click on on-screen options to select whether the circuit being designed should have certain features. Design editor 568 may be used to enter a design (e.g., by entering lines of hardware description language code), may be used to edit a design obtained from a library (e.g., using a design and constraint entry aid), or may assist a user in selecting and editing appropriate prepackaged code/designs.

Design and constraint entry tools 564 may be used to allow a circuit designer to provide a desired circuit design using any suitable format. For example, design and constraint entry tools 564 may include tools that allow the circuit designer to enter a circuit design using truth tables. Truth tables may be specified using text files or timing diagrams and may be imported from a library. Truth table circuit design and constraint entry may be used for a portion of a large circuit or for an entire circuit.

As another example, design and constraint entry tools 564 may include a schematic capture tool. A schematic capture tool may allow the circuit designer to visually construct integrated circuit designs from constituent parts such as logic gates and groups of logic gates. Libraries of preexisting integrated circuit designs may be used to allow a desired portion of a design to be imported with the schematic capture tools.

If desired, design and constraint entry tools 564 may allow the circuit designer to provide a circuit design to the circuit design system 400 using a hardware description language such as Verilog hardware description language (Verilog HDL), Very High Speed Integrated Circuit Hardware Description Language (VHDL), SystemVerilog, or a higher-level circuit description language such as OpenCL or SystemC, just to name a few. The designer of the integrated circuit design can enter the circuit design by writing hardware description language code with editor 568. Blocks of code may be imported from user-maintained or commercial libraries if desired.

After the design has been entered using design and constraint entry tools 564, behavioral simulation tools 572 may be used to simulate the functional performance of the circuit design. If the functional performance of the design is incomplete or incorrect, the circuit designer can make changes to the circuit design using design and constraint entry tools 564. The functional operation of the new circuit design may be verified using behavioral simulation tools 572 before synthesis operations have been performed using tools 574. Simulation tools such as behavioral simulation tools 572 may also be used at other stages in the design flow if desired (e.g., after logic synthesis). The output of the behavioral simulation tools 572 may be provided to the circuit designer in any suitable format (e.g., truth tables, timing diagrams, etc.).

Once the functional operation of the circuit design has been determined to be satisfactory, logic synthesis and optimization tools 574 may generate a gate-level netlist of the circuit design, for example using gates from a particular library pertaining to a targeted process supported by a foundry, which has been selected to produce the integrated circuit. Alternatively, logic synthesis and optimization tools 574 may generate a gate-level netlist of the circuit design using gates of a targeted programmable logic device (i.e., in the logic and interconnect resources of a particular programmable logic device product or product family).

Logic synthesis and optimization tools 574 may optimize the design by making appropriate selections of hardware to implement different logic functions in the circuit design based on the circuit design data and constraint data entered by the logic designer using tools 564. As an example, logic synthesis and optimization tools 574 may perform multi-level logic optimization and technology mapping based on the length of a combinational path between registers in the circuit design and corresponding timing constraints that were entered by the logic designer using tools 564.

After logic synthesis and optimization using tools 574, the circuit design system may use tools such as placement, routing, and physical synthesis tools 576 to perform physical design steps (layout synthesis operations). Tools 576 can be used to determine where to place each gate of the gate-level netlist produced by tools 574. For example, if two counters interact with each other, tools 576 may locate these counters in adjacent regions to reduce interconnect delays or to satisfy timing requirements specifying the maximum permitted interconnect delay. Tools 576 create orderly and efficient implementations of circuit designs for any targeted integrated circuit (e.g., for a given programmable integrated circuit such as a field-programmable gate array (FPGA)).

Tools such as tools 574 and 576 may be part of a compiler suite (e.g., part of a suite of compiler tools provided by a programmable logic device vendor). In certain embodiments, tools such as tools 574, 576, and 578 may also include timing analysis tools such as timing estimators. This allows tools 574 and 576 to satisfy performance requirements (e.g., timing requirements) before actually producing the integrated circuit.

After an implementation of the desired circuit design has been generated using tools 576, the implementation of the design may be analyzed and tested using analysis tools 578. For example, analysis tools 578 may include timing analysis tools, power analysis tools, or formal verification tools, just to name few.

After satisfactory optimization operations have been completed using tools 520 and depending on the targeted integrated circuit technology, tools 520 may produce a mask-level layout description of the integrated circuit or configuration data for programming the programmable logic device.

Figure 6:
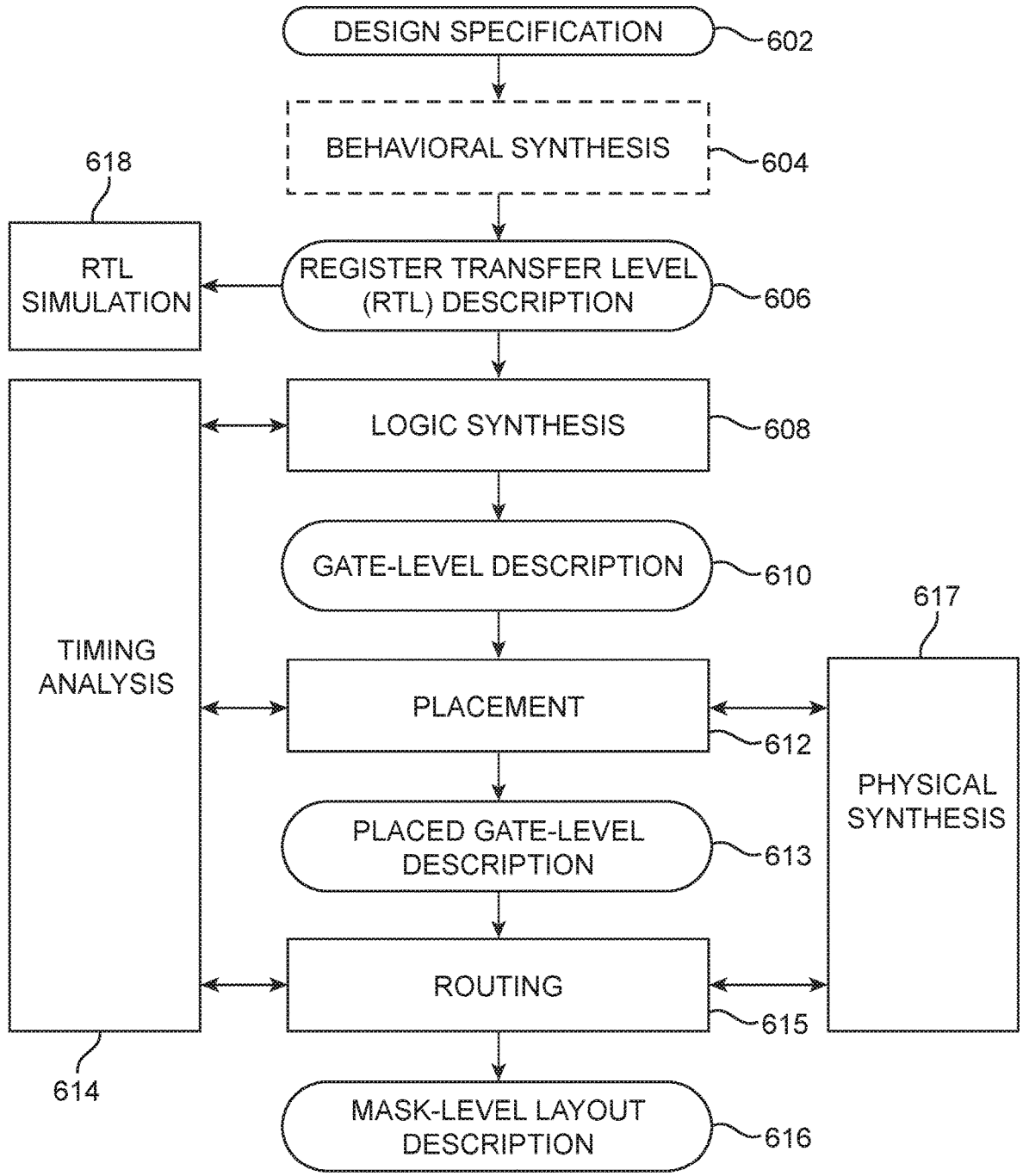
FIG. 6 is a flow chart of illustrative steps for designing an integrated circuit in accordance with an embodiment.

Illustrative operations involved in using tools 520 of FIG. 5 to produce the mask-level layout description of the integrated circuit are shown in FIG. 6. As shown in FIG. 6, a circuit designer may first provide a design specification 602. The design specification 602 may, in general, be a behavioral description provided in the form of an application code (e.g., C code, C++ code, SystemC code, OpenCL code, etc.). In some scenarios, the design specification may be provided in the form of a register transfer level (RTL) description 606.

The RTL description may have any form of describing circuit functions at the register transfer level. For example, the RTL description may be provided using a hardware description language such as the Verilog hardware description language (Verilog HDL or Verilog), the SystemVerilog hardware description language (SystemVerilog HDL or SystemVerilog), or the Very High Speed Integrated Circuit Hardware Description Language (VHDL). If desired, a portion or all of the RTL description may be provided as a schematic representation.

In general, the behavioral design specification 602 may include untimed or partially timed functional code (i.e., the application code does not describe cycle-by-cycle hardware behavior), whereas the RTL description 606 may include a fully timed design description that details the cycle-by-cycle behavior of the circuit at the register transfer level.

Design specification 602 or RTL description 606 may also include target criteria such as area use, power consumption, delay minimization, clock frequency optimization, or any combination thereof. The optimization constraints and target criteria may be collectively referred to as constraints.

Those constraints can be provided for individual data paths, portions of individual data paths, portions of a design, or for the entire design. For example, the constraints may be provided with the design specification 602, the RTL description 606 (e.g., as a pragma or as an assertion), in a constraint file, or through user input (e.g., using the design and constraint entry tools 564 of FIG. 5), to name a few.

At step 604, behavioral synthesis (sometimes also referred to as algorithmic synthesis) may be performed to convert the behavioral description into an RTL description 606. Step 604 may be skipped if the design specification is already provided in form of an RTL description.

At step 618, behavioral simulation tools 572 may perform an RTL simulation of the RTL description, which may verify the functionality of the RTL description. If the functionality of the RTL description is incomplete or incorrect, the circuit designer can make changes to the HDL code (as an example). During RTL simulation 618, actual results obtained from simulating the behavior of the RTL description may be compared with expected results.

During step 608, logic synthesis operations may generate gate-level description 610 using logic synthesis and optimization tools 574 from FIG. 5. If desired, logic synthesis operations may perform register retiming as illustrated in FIG. 2 according to the constraints that are included in design specification 602 or RTL description 606. The output of logic synthesis 608 is gate-level description 610.

During step 612, placement operations using for example placement tools 576 of FIG. 5 may place the different gates in gate-level description 610 in a preferred location on the targeted integrated circuit to meet given target criteria (e.g., minimize area and maximize routing efficiency or minimize path delay and maximize clock frequency or any combination thereof). The output of placement 612 is placed gate-level description 613, that satisfies the legal placement constraints of the underlying target device.

During step 615, routing operations using for example routing tools 576 of FIG. 5 may connect the gates from the placed gate-level description 613. Routing operations may attempt to meet given target criteria (e.g., minimize congestion, minimize path delay and maximize clock frequency or any combination thereof). The output of routing 615 is a mask-level layout description 616 (sometimes referred to as routed gate-level description 616). While placement and routing is being performed at steps 612 and 615, physical synthesis operations 617 may be concurrently performed to further modify and optimize the circuit design (e.g., using physical synthesis tools 576 of FIG. 5).

Typically, a circuit designer implements the RTL description of the desired logic design without regard to the capability of each logic element 34. In particular, logic synthesis operations 608 will carve the amorphous programmable logic 18 on device 10 (FIG. 1) into components that can be implemented in a logic element 34 or a portion of element 34. The place and route operations 612 and 615 implements a procedure called clustering, which gathers whole and fractional logic elements 34 together into logic array blocks. Tools 420 then arrange the logic array blocks according to various cost functions to create a desired final placement.

There are a variety of "What You See is What You Get" components supported by tools 420, which allow a designer to build an RTL description that is targeted more directly to the underlying hardware. As an example, CAD tools 420 might allow the RTL specification of an entire logic element 34, including all of the LUT mask options and signal steering options. This enables the designer to dictate solutions for an entire logic element 34, as well as groupings of logic elements 34 that form part of a logic array block. These groupings will traverse the RTL flow of FIG. 6 through logic synthesis and place and route operations largely unchanged, thus appearing in the final result. For example, a designer can elect to exploit a logic element's ability to generate a mixture of combinational and arithmetic functions simultaneously and thus fully utilize existing output wires.

While a conventional RTL flow will only allow selection of two function outputs per logic element (i.e., either two output bits on path 308 are selected or two output bits on path 310 are selected), an improved RTL flow is provided that allows the design to gain access to more than output function outputs per logic element. An exemplary operation that leverages this improvement is a 2×2 multiply operation that computes the product of a pair of two-bit numbers.

FIG. 7A is a diagram illustrating an unsigned two-by-two multiplication operation. The final output C is the product of a first 2-bit operand {A1, A0} and a second 2-bit operand {B1, B0}. In particular, FIG. 7A shows the partial products generated by these input bits. As shown in FIG. 7A, the least significant bit of the output C[0] is equal to A0*B0; the next bit C[1] is equal to (A1*B0+A0*B1); bit C[2] is equal to A1*B1 plus the carry out from C[1]; and the most significant bit of the output C[3] will be equal to carry out from C[2].

Figure 7B:
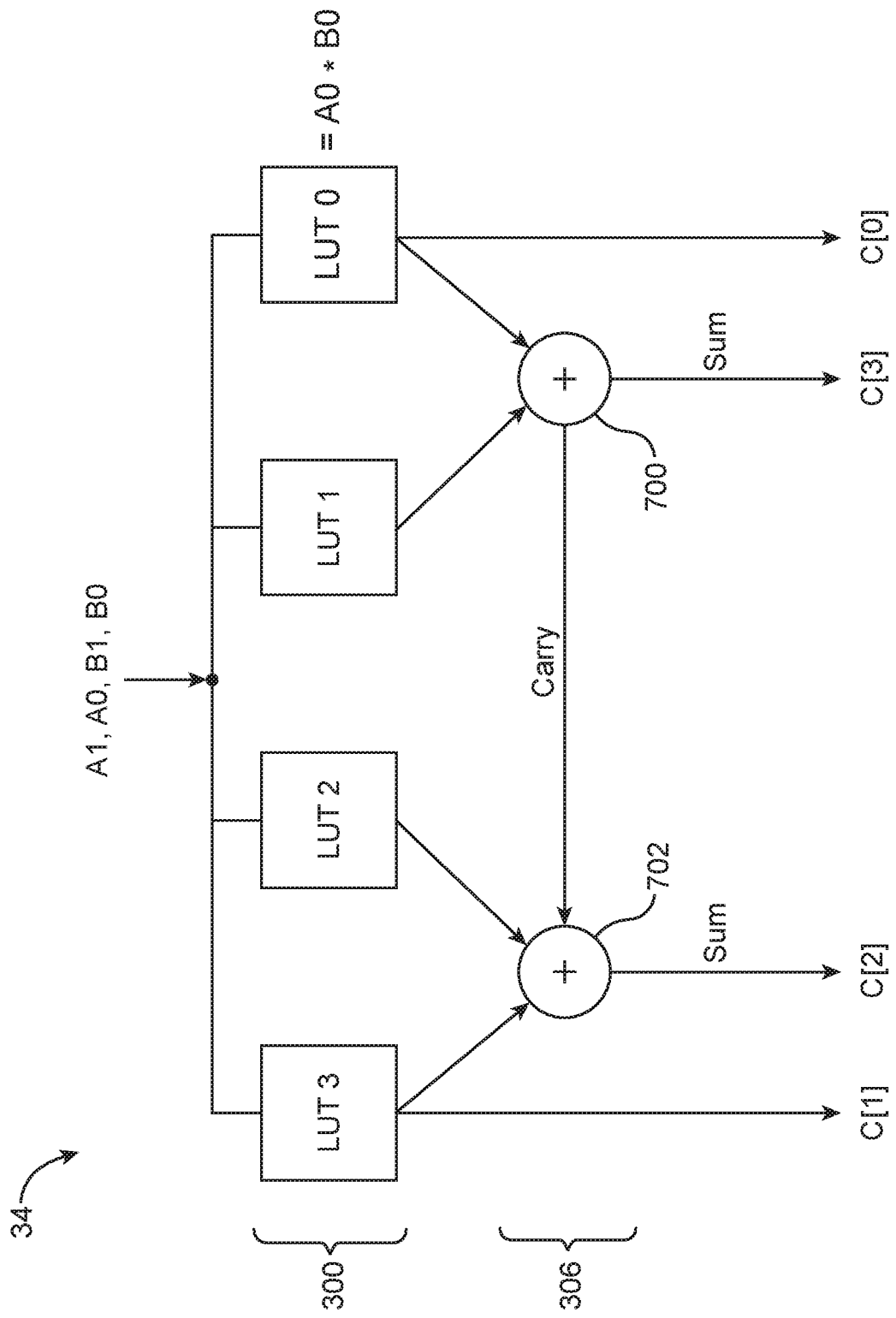
FIG. 7B is a diagram of an illustrative logic element configured to perform a two-by-two multiplication operation in accordance with an embodiment.

FIG. 7B shows how logic element 34 of the type shown in FIG. 3 may be configured to generate all four output bits C[3:0] of the 2×2 multiplication. As shown in FIG. 7B, the inputs bits of the two operands A1, A0, B1, and B0 are selectively fed to the lookup tables 300 (e.g., using input selection and driver circuitry 302 of FIG. 3). The first lookup table LUT0 may be configured to provide a combinational output that is equal to A0*B0, which is equal to C[0].

Adder circuitry 306 may include a first adder 700 and a second adder 702, which collectively form a ripple carry chain. Adder 700 may have a first input configured to receive signals from LUT0, a second input configured to receive signals from LUT1, a sum output on which C[3] is generated, and a carry output that is coupled to adder 702. Output C[3] will be equal to a logic "1" if A1, A0, B1, and B0 are all ones; otherwise, C[3] will be equal to a logic "0". The carry output of adder 700 can either be one or zero.

The truth table of LUT1 such as truth table 710 is shown in FIG. 7C. The first four columns of truth table 710 show all 16 possible combinations of the four inputs to LUT1. Column 712 shows the known combinatorial output generated by LUT0, which will be equal to logic "1" only when A0 and B0 are high. The desired C[3] output is shown in column 714. Bit C[3] is equal to logic "1" only when all four inputs are high. Given the known input pattern at the first input of adder 700 and the desired C[3] output pattern, it is then possible to compute the necessary output pattern for LUT1 (as indicated in column 716) that must be received at the second input of adder 700 to produce the desired C[3] bits. If column 714 represents the desired function, then column 716 represents the necessary "anti-function" that is needed to cancel out the known input pattern provided by LUT0 to generate the desired C[3] pattern. The corresponding carry output pattern of adder 700 is shown in column 718.

Referring back to FIG. 7B, lookup table LUT3 may be configured to provide a combinational output that is equal to logic "1" if (A1*B0+A0*B1) is high, which is equal to C[1] as shown in FIG. 7A. If A1*B0 and A0*B1 are both logic "1" or if A1*B0 and A0*B1 are both logic "0", then the combinatorial output of LUT3 is logic "0". This is shown by column 722 in the truth table 720 of FIG. 7D. The first four columns of truth table 720 show all 16 possible combinations of the four inputs to LUT3.

Referring again to FIG. 7B, adder 702 may have a first input configured to receive signals from LUT3, a second input configured to receive signals from LUT2, a carry input port that receives the carry output signal from adder 700, and a sum output on which C[2] is generated. Output C[2] will be equal to logic "1" if A1 and B1 are both ones; otherwise, C[2] will be equal to a logic "0" (as shown by column 724 of FIG. 7D).

As described above, column 722 shows the known combinatorial output generated by LUT3. The desired C[2] output is shown in column 724. The carry input pattern is carried over from column 718 of FIG. 7C (as shown by dotted path 711) and is also known. Given the known input pattern at the first input of adder 702, the known carry input pattern, and the desired C[2] output pattern, it is then possible to compute the necessary output pattern for LUT2 (as indicated in column 726) that must be received at the second input of adder 702 to produce the desired C[2] bits.

If column 724 represents the desired function, then column 726 represents the necessary "anti-function" that is needed to cancel out the known input pattern provided by columns 722 and 728 to generate the desired C[2] pattern.

As shown in FIG. 7B, first and second combinatorial outputs are used to output C[0] and C[1], respectively, while first and second arithmetic/sum outputs are used to output C[3] and C[2], respectively. Using at least four outputs from logic element 34 configured in this way doubles the effective density of element 34. The identification of solutions of this form is not a task that traditional synthesis software is able to handle. This process is too demanding in terms of the runtime to be part of the conventional software analysis. Once the desired functions and anti-functions are identified, however, the pattern can be readily repeated.

Figure 8B:
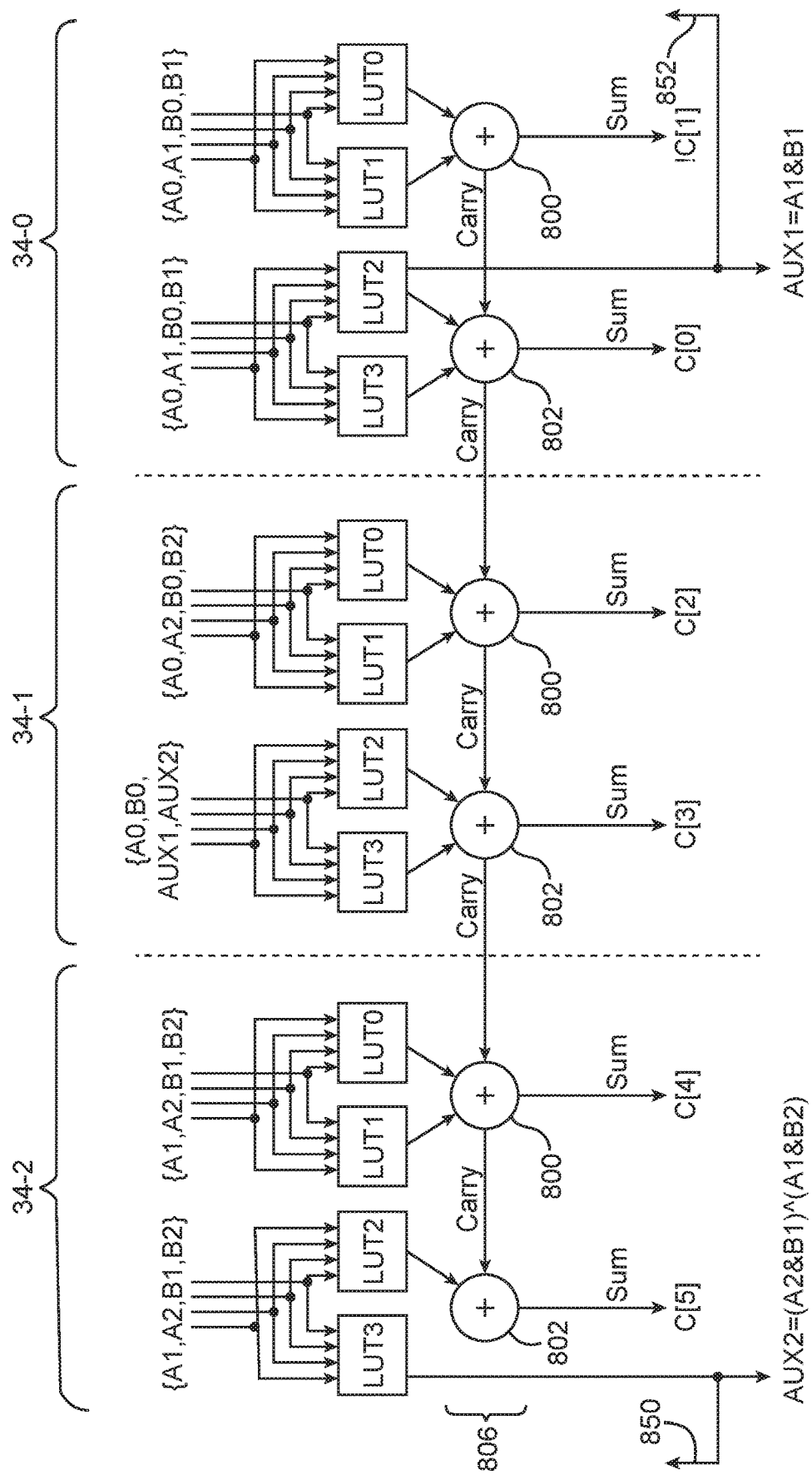
FIG. 8B is a diagram of multiple logic elements coupled together in a chain to perform a three-by-three multiplication operation in accordance with an embodiment.

The example of FIGS. 7A-7D in which a single logic element 34 is configured to support 2×2 multiplication is merely illustrative. In general, the techniques described herein can be applied to any combinatorial and/or arithmetic functions. FIGS. 8A and 8B show how the techniques described above can be extended to support a 3×3 multiplication operation that computes the product of a pair of three-bit numbers.

FIG. 8A is a diagram illustrating an unsigned three-by-three multiplication operation. The final output C is the product of a first 3-bit operand {A2, A1, A0} and a second 3-bit operand {B2, B1, B0}. In particular, FIG. 8A shows the partial products generated by these input bits. As shown in FIG. 8A, the least significant bit of the output C[0] is equal to A0*B0; the next bit C[1] is equal to (A1*B0+A0*B1); bit C[2] is equal to (A2*B0+A1*B1+A0*B2) plus the carry out from C[1]; bit C[3] is equal to (A2*B1+A1*B2) plus the carry out from C[2]; bit C[4] is equal to A2*B2 plus the carry out from C[3]; and MSB C[5] will be equal to the carry out from C[4].

FIG. 8B shows how multiple logic elements 34 may be chained together in series to generate all six output bits of a 3×3 multiplication. As shown in FIG. 8B, a first logic element 34-0, a second logic element 34-1, and a third logic element 34-1 may be coupled in series. In particular, each of the three logic elements may include adders 800 and 802 that are connected in a series to form a long carry chain 806 (e.g., to form a dedicated ripple carry adder chain with at least six adders in series).

Lookup tables LUT0 and LUT1 of logic element 34-0 may each receive input bits {A1, A0, B1, B0} and generate outputs to a corresponding adder 800 within logic element 34-0. Adder 800 in logic element 34-0 has a sum output on which an inverted version of C[1] (i.e., !C[1]) is provided and a carry output that is fed as an input to adder 802 within logic element 34-0. Lookup tables LUT2 and LUT3 of logic element 34-0 may each also receive input bits {A1, A0, B1, B0} and generate outputs to a corresponding adder 802 within logic element 34-0. Adder 802 in logic element 34-0 has a sum output on which C[0] is provided and a carry output that is fed as an input to adder 800 within subsequent logic element 34-1. In particular, LUT2 within logic element 34-0 has a combinatorial output on which a first helper function or auxiliary output AUX1 is provided. The AUX1 function is simply the logic AND of A1 and B1. This auxiliary output may be fed back as an input to another LUT (e.g., LUT2 and LUT3 of element 34-1), as indicated by feedback path 852.

Lookup tables LUT0 and LUT1 of logic element 34-1 may each receive input bits {A2, A0, B2, B0} and generate outputs to a corresponding adder 800 within logic element 34-1. Adder 800 in logic element 34-1 has a sum output on which C[2] is generated and a carry output that is fed as an input to adder 802 within logic element 34-1. Lookup tables LUT2 and LUT3 of logic element 34-1 may each receive input bits {A0, B0, AUX1, AUX2} and generate outputs to a corresponding adder 802 within logic element 34-1. As described above, the AUX1 input is generated directly by LUT2 of logic element 34-1. The generation of the AUX2 input is described below in connection with logic element 34-2. Adder 802 in logic element 34-1 has a sum output on which C[3] is provided and a carry output that is fed as an input to adder 800 within subsequent logic element 34-2.

Lookup tables LUT0 and LUT1 of logic element 34-2 may each receive input bits {A2, A1, B2, B1} and generate outputs to a corresponding adder 800 within logic element 34-2. Adder 800 of logic element 34-2 has a sum output on which C[4] is generated and a carry output that is fed as an input to adder 802 within logic element 34-2. Lookup tables LUT2 and LUT3 of logic element 34-1 may each also receive input bits {A2, A1, B2, B1} and generate outputs. Adder 802 in logic element 34-2 has a sum output on which C[5] is provided. In particular, LUT3 within logic element 34-2 has a combinatorial output on which a second helper function or auxiliary output AUX2 is provided. The AUX2 function is equal to the logical OR of (A2&B2) and (A1&B2). This auxiliary output may be fed back as an input to another LUT (e.g., LUT2 and LUT3 of element 34-1), as indicated by feedback path 850.

Connected in this way, LUT2 of logic element 34-2 may be configured as the requisite anti-function that is needed to negate or counteract the carry input at adder 802 to produce the desired C[5] output. LUT1 of element 34-2 may contribute to the carry input of adder 802. Similarly, LUT0 of element 34-2 may be configured as the requisite anti-function that is needed to negate or counterbalance the combinatorial output from LUT1 and the carry input at adder 800 to produce the desired C[4] output.

Similarly, LUT2 of logic element 34-1 may be configured as the requisite anti-function that is needed to negate or counteract the carry input at adder 802 to produce the desired C[3] output. LUT3 of element 34-1 may contribute to the carry output of adder 802, whereas LUT1 of element 34-1 may contribute to the carry input of adder 802. Lookup table LUT0 of element 34-1 may be configured as the requisite anti-function that is needed to negate or counterbalance the combinatorial output from LUT1 and the carry input at adder 800 to produce the desired C[2] output.

Lastly, LUT2 of logic element 34-0 may be configured as the requisite anti-function that is needed to negate or counteract the carry input at adder 802 to produce the desired C[0] output. LUT3 of element 34-0 may contribute to the carry output of adder 802, whereas LUT1 of element 34-0 may contribute to the carry input of adder 802. Lookup table LUT0 of element 34-0 may be configured as the requisite anti-function that is needed to negate or counterbalance the combinatorial output from LUT1 to produce the desired !C[1] output.

The example of FIGS. 8A-8B in which three logic elements 34 are chained together to support 3×3 multiplication is merely illustrative. In general, the techniques described herein can be applied to 4×4 multiplication, 5×5 multiplication, fixed-point multiplication of any size, floating-point multiplication of any size, or even larger arithmetic operations.

The examples of FIGS. 7 and 8 in which one or more logic element(s) 34 are used to support multiplication operations is merely illustrative and are not intended to limit the scope of the present embodiments. In another suitable arrangement, a single logic element 34 may be configured to support at least three non-arithmetic/non-mathematical functions (where only two function outputs would be available in a conventional adaptive logic module). The ability to add more function outputs grants more compute power within the same resource footprint.

Figure 9A:
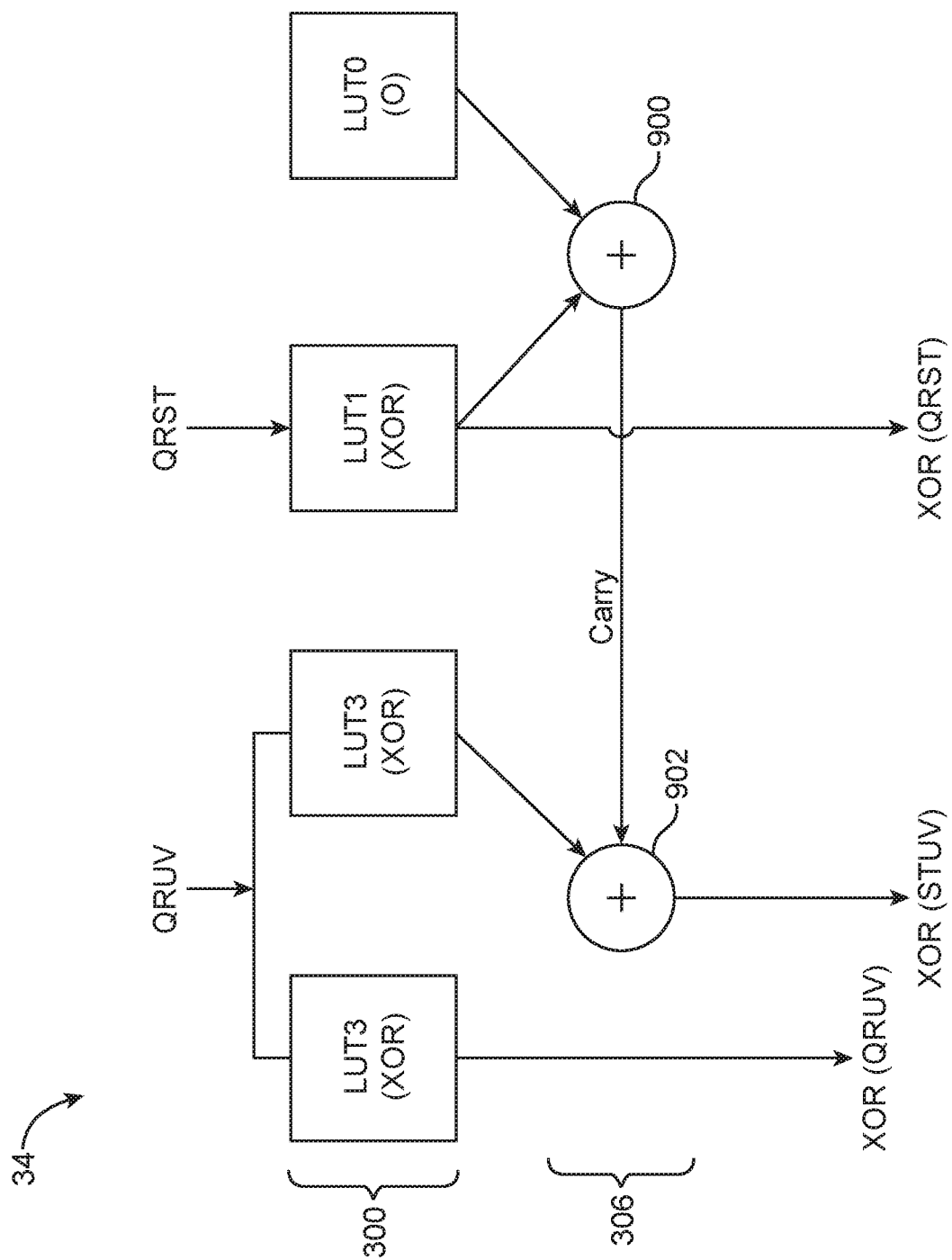
FIG. 9A is a diagram of an illustrative logic element configured to simultaneously support more than two combinatorial functions in accordance with an embodiment.

FIG. 9A is a diagram of an illustrative logic element 34 configured to simultaneously support more than two combinatorial functions (e.g., at least three logic exclusive-OR or XOR functions) in accordance with an embodiment. A programmable device that can support a large number of XOR operations may be particularly suitable for applications that use Galois mathematics, Reed Solomon encoding, error correction algorithms, etc.

As shown in FIG. 9A, LUT0 is configured to simply output zero, whereas lookup tables LUT1, LUT2, and LUT3 are each configured as a four-input XOR function. The truth table (sometimes referred to as a "LUT mask") for each of LUT1, LUT2, and LUT3 that implements an XOR function is shown in FIG. 9B. In particular, LUT1 is configured to receive input signals QRST, whereas both LUT2 and LUT3 are configured to receive input signals QRUV. Note that LUT1 has a combinatorial output on which the result of the exclusive-OR of QRST is directly generated. Similarly, LUT3 has a combinational output on which the result of the XOR of QRUV is directly generated.

Adder circuitry 306 has a carry chain that includes adder 900 and adder 902. Adder 900 is configured to receive signals from LUT0 and LUT1 and has a carry output that is fed as an input to adder 902. Adder 902 is configured to receive signals from LUT2 and the carry from adder 900. Configured in this way, adder 902 will compute the exclusive-OR of XOR(QRST) with XOR(QRUV), which simplifies to the XOR of STUV. Operated in this way, logic element 34 is capable of generating at least three different XOR function outputs (i.e., XOR(QRST), XOR(QRUV), and XOR(STUV)). In this example, LUT2 serves as the anti-function that cancels out the QR portion of XOR (QRST) to create XOR(UVST).

The example of FIG. 9A in which logic element 34 is configured to support three XOR function is merely illustrative. If desired, logic element 34 may be configured to support three or more combinatorial functions of any kind (e.g., three or more of the same combinational function, three or more different combinational functions, or any suitable mix of combinational functions), four or more combinatorial functions of any type, etc.

Figure 10:
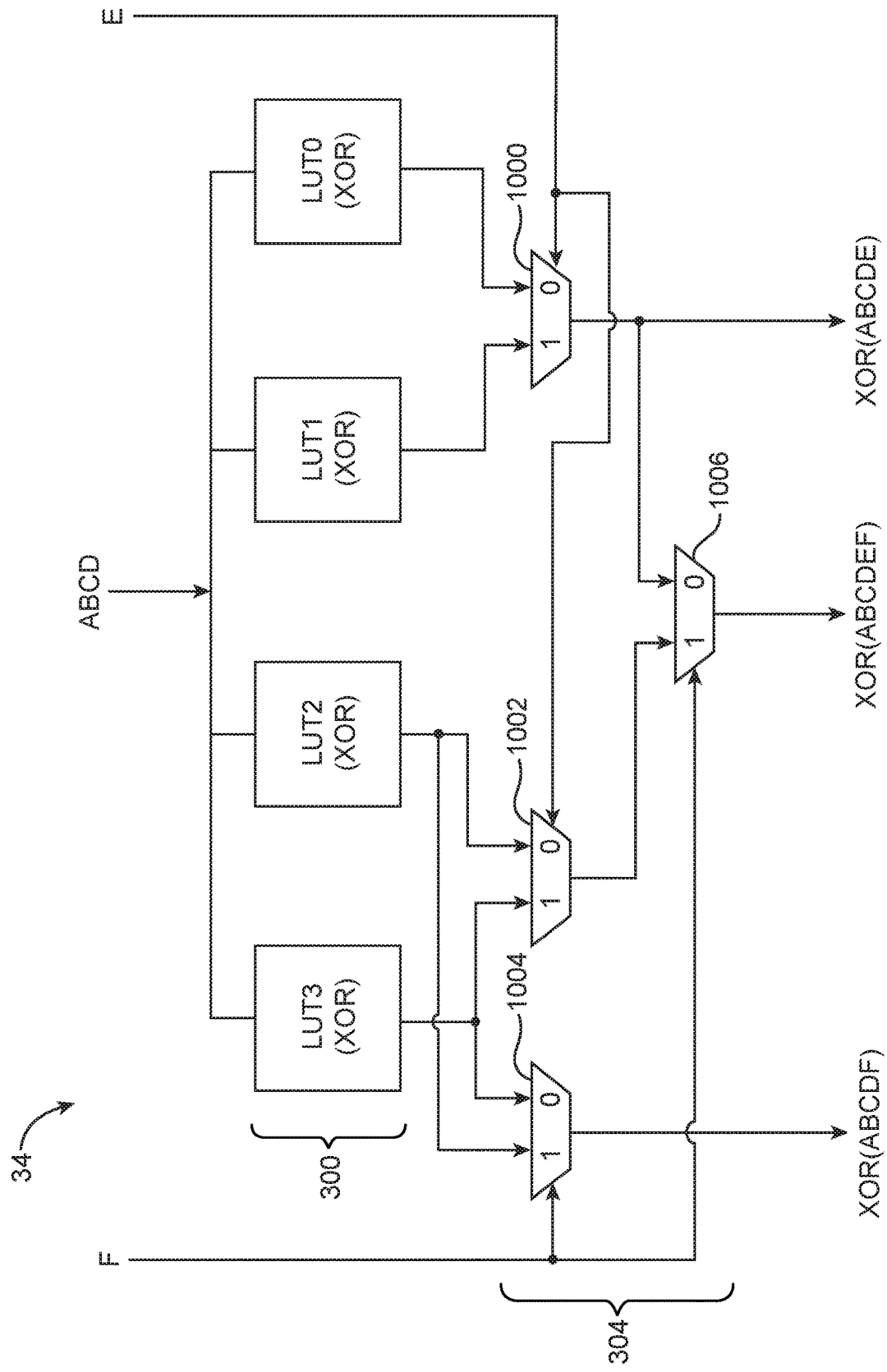
FIG. 10 is a diagram of an illustrative logic element configured to simultaneously support more than two combinatorial functions without using a carry adder chain in accordance with an embodiment.

In the example of FIG. 9A, logic element 34 utilizes the carry chain 306 to generate the third additional combinatorial output. In accordance with another suitable arrangement, logic element 34 may be configured to output more than two combinational function outputs without using the carry chain (see, e.g., FIG. 10). As shown in FIG. 10, logic element 34 may receive input bits ABCD, all of which are selectively fed to the lookup tables 300 (e.g., using input selection and driver circuitry 302 of FIG. 3). Lookup tables LUT0, LUT1, LUT2, and LUT3 are each configured as a four-input XOR function. The truth table for each of LUT0-LUT3 that implements an XOR function is shown in FIG. 9B.

The outputs of LUT0-LUT3 are routed to multiplexers within circuitry 304 (see, e.g., multiplexing and routing circuitry 304 in FIG. 3). As shown in FIG. 10, circuitry 304 may include at least multiplexers 1000, 1002, 1004, and 1006. Multiplexer 1000 has a first (0) input that receives signals directly from LUT0, a second (1) input that receives signals directly from LUT1, and a control input that receives input signal E. Multiplexer 1002 has a first (0) input that receives signals directly from LUT2, a second (1) input that receives signals directly from LUT3, and a control input that also receives input signal E. Multiplexer 1004 has a first (0) input that receives signals directly from LUT2, a second (1) input that receives signals directly from LUT3, and a control input that receives input signal F. Multiplexer 1006 has a first (0) input that receives signals directly from the output of multiplexer 1002, a second (1) input that receives signals directly from the output of multiplexer 1000, and a control input that receives input signal F. Configured in this way, multiplexer 1000 will generate XOR(ABCDE) at its output, multiplexer 1004 will generate XOR(ABCDF) at its output, and multiplexer 1006 will generate XOR(ABCDEF) at its output.

The example of FIG. 10 in which logic element 34 is configured to support three XOR function without using the carry chain is merely illustrative. If desired, logic element 34 may be configured to support three or more combinatorial functions of any kind without adder circuitry 306 (e.g., three or more of the same combinational function, three or more different combinational functions, or any suitable mix of combinational functions), four or more combinatorial functions of any type without using the ripple carry chain, etc.

Figure 11:
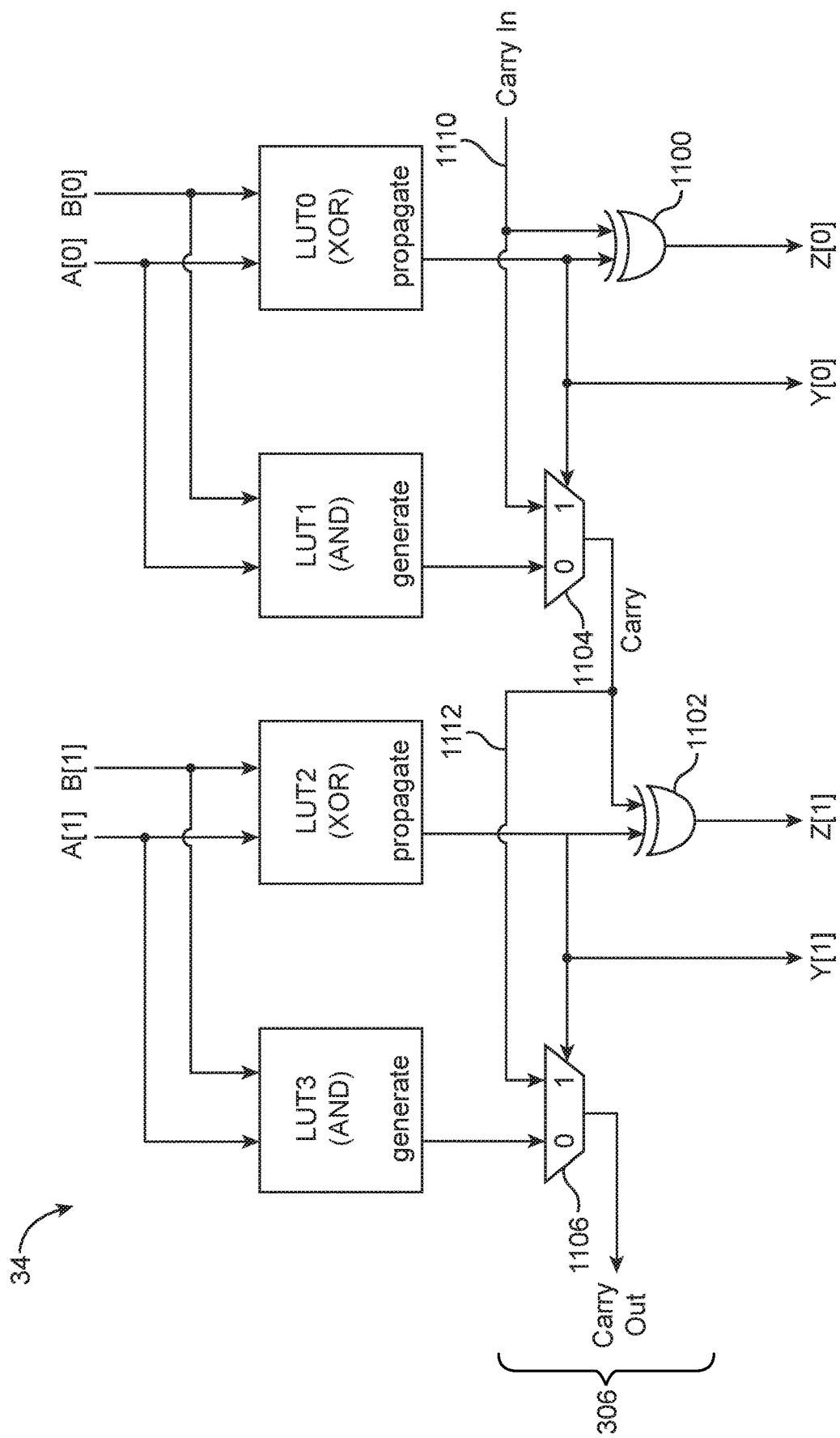
FIG. 11 is a diagram of an illustrative logic element configured to simultaneously support an arithmetic function and a combinatorial function in accordance with an embodiment.

The examples of FIGS. 7 and 8 in which one or more logic element(s) 34 are used to support multiplication operations and the examples of FIGS. 9 and 10 in which logic element 34 is used to support at least three combinatorial outputs is merely illustrative. In accordance with yet another suitable embodiment, logic element 34 may be configured to simultaneously support arithmetic and combinatorial functions in parallel. FIG. 11 illustrates an example in which logic element 34 receives two 2-bit inputs {A1, A0} and {B1, B0} and computes both sum (A+B) and bitwise sum XOR(AB), which might be useful in long arithmetic addition operations. In the example of FIG. 11, XOR(AB) will yield Y[1:0], whereas (A+B) will yield Z[1:0].

As shown in FIG. 11, LUT0 and LUT1 are configured to receive input bits A[0] and B[0], whereas LUT2 and LUT3 are configured to receive input bits A[1] and B[1]. LUT0 and LUT2 are configured as logic XOR functions and thus produce "propagate" output signals, whereas LUT1 and LUT3 are configured as logic AND functions and thus produce "generate" output signals. In particular, adder carry chain 306 may be implemented using logic XOR gates 1100 and 1102 and multiplexers 1104 and 1106. Carry chain 306 may include other adder hardware, but the unused inputs and logic gates are not shown to avoid obscuring the present embodiments. Logic XOR gate 1100 has a first input that receives the propagate signal directly from the output of LUT0, a second input that receives a carry signal (e.g., from another logic element 34) via direct connection carry path 1110, and an output on which output signal Z[0] is generated. The propagate signal generated directly at the output of LUT0 is equivalent to output signal Y[0].

Multiplexer 1104 has a first (0) input that receives signals directly from the output of LUT1, a second (1) input that receives the carry in from path 1110, a control input that receives signals directly from the output of LUT0, and an output on which a carry output signal is generated.

Logic XOR gate 1102 has a first input that receives the propagate signal directly from the output of LUT2, a second input that receives the carry signal from the output of multiplexer 1104, and an output on which output signal Z[1] is generated. The propagate signal generated directly at the output of LUT2 is equivalent to output signal Y[1].

Multiplexer 1106 has a first (0) input that receives signals directly from the output of LUT3, a second (1) input that receives the carry signal from the output of multiplexer 1104, a control input that receives signals directly from the output of LUT2, and an output on which a carry output signal is generated.

The circuit of FIG. 11 utilizes all four outputs of logic element 34 to generate XOR output Y[1:0] and sum output Z[1:0]. The example of FIG. 11 uses 2-bit inputs, but the techniques illustrated herein can be expanded to support longer inputs by connecting multiple instances of logic elements 34 together (see, e.g., FIG. 8B in which two or more logic elements 34 are serially coupled in a chain). One use case for this circuit is to calculate A+B to get the "generate" output and then AND together all of the XOR (AB) bits to get the desired "propagate" output. Generate and propagate signals produced in this way can be used to create a set of carry's via a prefix network for a very large adder circuit, where A+B is a subsegment of the larger adder.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs), microcontrollers, microprocessors, central processing units (CPUs), graphics processing units (GPUs), etc. Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

EXAMPLES

The following examples pertain to further embodiments.

Example 1 is an integrated circuit, comprising: a logic element that comprises: a first lookup table configured to directly generate a combinatorial function output; a second lookup table configured to generate an anti-function output that complements the combinatorial function output; and an adder configured to combine the combinatorial function output generated by the first lookup table with the anti-function output generated by the second lookup table to produce a corresponding arithmetic function output, wherein the combinatorial function output and the arithmetic function output are simultaneously active.

Example 2 is the integrated circuit of example 1, wherein the logic element further comprises: a third lookup table configured to directly generate an additional combinatorial function output; a fourth lookup table configured to configured to generate an additional anti-function output that complements the additional combinatorial function output; and an additional adder configured to combine the additional combinatorial function output generated by the third lookup table with the additional anti-function output generated by the fourth lookup table to produce an additional arithmetic function output.

Example 3 is the integrated circuit of example 2, wherein the logic element is configured to multiply a first two-bit input signal by a second two-bit input signal.

Example 4 is the integrated circuit of example 2, wherein the additional combinatorial function output and the additional arithmetic function output are simultaneously active with the combinatorial function output and the arithmetic function output, and wherein the adder is configured to receive a carry signal from the additional adder.

Example 5 is the integrated circuit of any one of examples 2-4, wherein the logic element is configured to support more than two combinatorial functions.

Example 6 is the integrated circuit of example 5, wherein the logic element further comprises: a third lookup table configured to directly generate an additional combinatorial function output; a fourth lookup table configured to configured to output zero; and an additional adder configured to combine the additional combinatorial function output generated by the third lookup table with the zero generated by the fourth lookup table to produce a carry signal that is fed to the adder.

Example 7 is the integrated circuit of example 6, wherein the combinatorial function output, the additional combinatorial function output, and the arithmetic function output comprise at least three different exclusive-OR function outputs.

Example 8 is the integrated circuit of any one of examples 1-7, further comprising: a first additional logic element; and a second additional logic element, wherein the first and second additional logic elements are coupled in a chain.

Example 9 is the integrated circuit of example 8, wherein the logic element, the first additional logic element, and the second additional logic element are configured to multiply a first three-bit input signal by a second three-bit input signal.

Example 10 is the integrated circuit of example 8, wherein the first additional logic element comprises an additional lookup table configured to generate an additional combinatorial function output that is fed back as an input to at least one other lookup table within either the logic element, the first additional logic element, or the second additional logic element.

Example 11 is an integrated circuit, comprising: a logic element that comprises: a first lookup table; a second lookup table; a third lookup table; a fourth lookup table; a first output on which a first combinatorial function output is generated using signals produced by at least one of the first and second lookup tables; a second output on which a second combinatorial function output is generated using signals produced by at least one of the third and fourth lookup tables; and a third output on which a third combinatorial function output is generated using signals produced by at least one of the first, second, third, and fourth lookup tables.

Example 12 is the integrated circuit of example 11, wherein the first, second, third, and fourth lookup tables are all configured to support the same logic function.

Example 13 is the integrated circuit of any one of examples 11-12, wherein the first, second, third, and fourth lookup tables are configured to receive a plurality of input signals, and wherein the logic element further comprises multiplexing circuitry configured to receive additional input signals other than the plurality of input signals.

Example 14 is the integrated circuit of example 13, wherein the multiplexing circuitry comprises: a first multiplexer configured to receive signals from the first and second lookup tables and to generate the first combinatorial function output, wherein the first multiplexer is controlled by a first input signal in the additional input signals; and a second multiplexer configured to receive signals from the third and fourth lookup tables and to generate the second combinatorial function output, wherein the second multiplexer is controlled by a second input signal in the additional input signals.

Example 15 is the integrated circuit of example 14, wherein the multiplexing circuitry further comprises: a third multiplexer configured to receive signals from the first and second multiplexers and to generate the third combinatorial function output, wherein the third multiplexer is controlled by the first input signal in the additional input signals.

Example 16 is an integrated circuit, comprising: a logic element that comprises: a plurality of lookup tables; and an adder carry chain configured to receive signals from the plurality of lookup tables and further configured to simultaneously generate an arithmetic function output and a combinatorial function output.

Example 17 is the integrated circuit of example 16, wherein the plurality of lookup tables comprises: a first lookup table configured as a first logic function; a second lookup table configured as a second logic function; a third lookup table configured as the first logic function; and a fourth lookup table configured as the second logic function.

Example 18 is the integrated circuit of example 17, wherein the first logic function is a logic XOR function, and wherein the second logic function is a logic AND function.

Example 19 is the integrated circuit of any one of examples 17-18, wherein the adder carry chain comprises logic XOR gates configured to generate output bits for the arithmetic function output.

Example 20 is the integrated circuit of any one of examples 16-20, wherein a subset of the plurality of lookup tables within the logic element is configured to directly generate output bits for the combinatorial function output.

For instance, all optional features of the apparatus described above may also be implemented with respect to the method or process described herein. The foregoing is merely illustrative of the principles of this disclosure and various modifications can be made by those skilled in the art. The foregoing embodiments may be implemented individually or in any combination.

What is claimed is:

1. An integrated circuit, comprising:
    a logic element that comprises:
        a first lookup table configured to directly generate a combinatorial function output;
        a second lookup table configured to generate an anti-function output that complements the combinatorial function output; and
        an adder configured to combine the combinatorial function output generated by the first lookup table with the anti-function output generated by the second lookup table to produce a corresponding arithmetic function output, wherein the combinatorial function output and the arithmetic function output are simultaneously active.

2. The integrated circuit of claim 1, wherein the logic element further comprises:
    a third lookup table configured to directly generate an additional combinatorial function output;
    a fourth lookup table configured to configured to generate an additional anti-function output that complements the additional combinatorial function output; and
    an additional adder configured to combine the additional combinatorial function output generated by the third lookup table with the additional anti-function output generated by the fourth lookup table to produce an additional arithmetic function output.

3. The integrated circuit of claim 2, wherein the logic element is configured to multiply a first two-bit input signal by a second two-bit input signal.

4. The integrated circuit of claim 2, wherein the additional combinatorial function output and the additional arithmetic function output are simultaneously active with the combinatorial function output and the arithmetic function output, and wherein the adder is configured to receive a carry signal from the additional adder.

5. The integrated circuit of claim 1, wherein the logic element is configured to support more than two combinatorial functions.

6. The integrated circuit of claim 5, wherein the logic element further comprises:
    a third lookup table configured to directly generate an additional combinatorial function output;
    a fourth lookup table configured to configured to output zero; and
    an additional adder configured to combine the additional combinatorial function output generated by the third lookup table with the zero generated by the fourth lookup table to produce a carry signal that is fed to the adder.

7. The integrated circuit of claim 6, wherein the combinatorial function output, the additional combinatorial function output, and the arithmetic function output comprise at least three different exclusive-OR function outputs.

8. The integrated circuit of claim 1, further comprising:
    a first additional logic element; and
    a second additional logic element, wherein the first and second additional logic elements are coupled in a chain.

9. The integrated circuit of claim 8, wherein the logic element, the first additional logic element, and the second additional logic element are configured to multiply a first three-bit input signal by a second three-bit input signal.

10. The integrated circuit of claim 8, wherein the first additional logic element comprises an additional lookup table configured to generate an additional combinatorial function output that is fed back as an input to at least one other lookup table within either the logic element, the first additional logic element, or the second additional logic element.

11. An integrated circuit, comprising:
    a logic element that comprises:
        a first lookup table;
        a second lookup table;
        a third lookup table;
        a fourth lookup table;
        a first output on which a first combinatorial function output is generated using signals produced by at least one of the first and second lookup tables;

a second output on which a second combinatorial function output is generated using signals produced by at least one of the third and fourth lookup tables; and a third output on which a third combinatorial function output is generated using signals produced by at least one of the first, second, third, and fourth lookup tables.

12. The integrated circuit of claim 11, wherein the first, second, third, and fourth lookup tables are all configured to support the same logic function.

13. The integrated circuit of claim 11, wherein the first, second, third, and fourth lookup tables are configured to receive a plurality of input signals, and wherein the logic element further comprises multiplexing circuitry configured to receive additional input signals other than the plurality of input signals.

14. The integrated circuit of claim 13, wherein the multiplexing circuitry comprises:

a first multiplexer configured to receive signals from the first and second lookup tables and to generate the first combinatorial function output, wherein the first multiplexer is controlled by a first input signal in the additional input signals; and a second multiplexer configured to receive signals from the third and fourth lookup tables and to generate the second combinatorial function output, wherein the second multiplexer is controlled by a second input signal in the additional input signals.

15. The integrated circuit of claim 14, wherein the multiplexing circuitry further comprises:

a third multiplexer configured to receive signals from the first and second multiplexers and to generate the third combinatorial function output, wherein the third multiplexer is controlled by the first input signal in the additional input signals.

16. An integrated circuit, comprising:
a logic element that comprises:
a plurality of lookup tables; and
an adder carry chain configured to receive signals from the plurality of lookup tables and further configured to simultaneously generate an arithmetic function output and a combinatorial function output, wherein the adder carry chain comprises logic XOR gates configured to generate output bits for the arithmetic function output.

17. The integrated circuit of claim 16, wherein the plurality of lookup tables comprises:

a first lookup table configured as a first logic function;
a second lookup table configured as a second logic function;
a third lookup table configured as the first logic function; and
a fourth lookup table configured as the second logic function.

18. The integrated circuit of claim 17, wherein the first logic function is a logic XOR function, and wherein the second logic function is a logic AND function.

19. The integrated circuit of claim 16, wherein a subset of the plurality of lookup tables within the logic element is configured to directly generate output bits for the combinatorial function output.

* * * * *